US009865702B2

(12) United States Patent
Huang et al.

(10) Patent No.: US 9,865,702 B2
(45) Date of Patent: Jan. 9, 2018

(54) METHOD FOR MANUFACTURING LATERALLY INSULATED-GATE BIPOLAR TRANSISTOR

(71) Applicant: CSMC TECHNOLOGIES FAB1 CO., LTD., Wuxi New District, Jiangsu (CN)

(72) Inventors: Feng Huang, Jiangsu (CN); Guangtao Han, Jiangsu (CN); Guipeng Sun, Jiangsu (CN); Feng Lin, Jiangsu (CN); Longjie Zhao, Jiangsu (CN); Huatang Lin, Jiangsu (CN); Bing Zhao, Jiangsu (CN); Lixiang Liu, Jiangsu (CN); Liangliang Ping, Jiangsu (CN); Fengying Chen, Jiangsu (CN)

(73) Assignee: CSMC Technologies Fab2 Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 15/541,155

(22) PCT Filed: Sep. 28, 2015

(86) PCT No.: PCT/CN2015/090965
§ 371 (c)(1),
(2) Date: Jun. 30, 2017

(87) PCT Pub. No.: WO2016/107234
PCT Pub. Date: Jul. 7, 2016

(65) Prior Publication Data
US 2017/0358657 A1 Dec. 14, 2017

(30) Foreign Application Priority Data
Dec. 30, 2014 (CN) .......................... 2014 1 0849111

(51) Int. Cl.
*H01L 29/66* (2006.01)
*H01L 29/739* (2006.01)
(Continued)

(52) U.S. Cl.
CPC .. *H01L 29/66325* (2013.01); *H01L 21/02164* (2013.01); *H01L 21/02211* (2013.01);
(Continued)

(58) Field of Classification Search
None
See application file for complete search history.

(56) References Cited

U.S. PATENT DOCUMENTS 8,866,252 B2 * 10/2014 Trajkovic ............ H01L 29/7816
257/492
9,111,898 B2 * 8/2015 Lin ...................... H01L 21/0257
(Continued)

FOREIGN PATENT DOCUMENTS

| CN | 101488525 | 7/2009 |
| CN | 101924131 | 12/2010 |
| WO | 02/37547 | 5/2002 |

OTHER PUBLICATIONS

International Search Report for international application No. PCT/CN2015/090965, dated Dec. 11, 2015 (4 pages, including English translation).

*Primary Examiner* — Asok K Sarkar
(74) *Attorney, Agent, or Firm* — Hamre, Schumann, Mueller & Larson, P.C.

(57) ABSTRACT

The present invention relates to a method for manufacturing a laterally insulated-gate bipolar transistor, comprising: providing a wafer having an N-type buried layer (10), an STI (40), and a first N well (22)/a first P well (24) which are formed successively from above a substrate; depositing and forming a high-temperature oxide film on the first N well (22) of the wafer; performing thermal drive-in on the wafer and performing photoetching and etching on the high-temperature oxide film to form a mini oxide layer (60); performing photoetching and ion implantation so as to form a second N well (32) inside the first N well (22) and second
(Continued)

P wells (34) inside the first N well (22) and the first P well (24); then successively forming a gate oxide layer and a polysilicon gate (72), wherein one end of the gate oxide layer and the polysilicon gate (72) extends onto the second P well (34) inside the first N well (22), and the other end extends onto the mini oxide layer (60) on the second N well (32); and photoetching and injecting N-type ions between the mini oxide layer (60) and the STI (40) adjacent to the mini oxide layer (60) to form a drain electrode, and at the same time forming a source electrode (51) inside the second P well (34).

5 Claims, 3 Drawing Sheets

(51) Int. Cl.
*H01L 21/02* (2006.01)
*H01L 21/311* (2006.01)
*H01L 21/265* (2006.01)
*H01L 29/06* (2006.01)
*H01L 29/40* (2006.01)

(52) U.S. Cl.
CPC .. *H01L 21/02271* (2013.01); *H01L 21/02318* (2013.01); *H01L 21/26513* (2013.01); *H01L 21/31116* (2013.01); *H01L 29/0653* (2013.01); *H01L 29/408* (2013.01); *H01L 29/7393* (2013.01)

(56) References Cited

U.S. PATENT DOCUMENTS

| | | | |
|---|---|---|---|
| 9,647,065 B2* | 5/2017 | Yang | H01L 29/0821 |
| 9,698,024 B2* | 7/2017 | Lin | H01L 21/308 |
| 9,721,939 B2* | 8/2017 | Karino | H01L 27/0248 |
| 2009/0096022 A1 | 4/2009 | Chang et al. | |
| 2015/0035587 A1* | 2/2015 | Tsai | H01L 29/7393 |
| | | | 327/438 |
| 2016/0172485 A1* | 6/2016 | Yanagi | H01L 27/0207 |
| | | | 257/343 |

* cited by examiner

METHOD FOR MANUFACTURING LATERALLY INSULATED-GATE BIPOLAR TRANSISTOR

FIELD OF THE INVENTION

The present disclosure relates to the semiconductor technology, and in particular relates a method of manufacturing the lateral insulated-gate bipolar transistor (LIGBT).

BACKGROUND OF THE INVENTION

As for a BIPOLAR-CMOS-DMOS (BCD) platform of 0.18 micrometers, after adding a mini-oxide structure of silicon dioxide material on a side of the channel region that is adjacent to the drain, the surface electric field of the LDMOS can be significantly reduced without increasing the region of the LDMOS, thereby addressing the degradation problem of the Idlin (linear drain current)/Rdson (on resistance) after a current and voltage test.

As to this mini-oxide, the conventional process utilizes silicon nitride as a hard mask to grow silicon dioxide via furnace tube and in certain region (i.e. the Local Oxidation of Silicon (LOCOS) technology). In particular, the silicon nitride can be used as a hard mask, a region that is required to have mini-oxide formed thereon is photo etched and defined, the silicon nitride in the region is etched away, the silicon dioxide grows in the furnace tube and on the device, and the silicon nitride is removed by phosphoric acid. However, the process has the following defect: as shown in FIG. 1, a large number of dislocations are introduced on the edge of the active region of the device, which will affect the reliability of the product.

SUMMARY OF THE INVENTION

In view of this, it is necessary to provide a method of manufacturing LIGBT that can address the dislocation problem in the edge of the active region due to the structure of the mini-oxide.

A method of manufacturing lateral insulated-gate bipolar transistor includes the steps of: providing a wafer having a N-type buried layer, a shallow trench isolation structure formed on the N-type buried layer, a first N well formed on the N-type buried layer and a first P well formed on the N-type buried layer; forming a high temperature oxide (HTO) film on the first N well by depositing, wherein a depositing temperature is between 750° C. to 850° C.; performing a thermal drive-in to the wafer, and performing photolithography and etching to the HTO film to form a mini-oxide layer; performing photolithography and ion implantation, thus forming a second N well in the first N well, and forming a second P well in the first N well and the first P well; forming a gate oxide layer and a polycrystalline gate subsequently, wherein one end of the gate oxide layer and the polycrystalline silicon gate extends to the second P well in the first N well, and the other end of the gate oxide layer and the polycrystalline silicon gate extends to the mini-oxide layer on the second N well; and performing photolithography and implanting N-type ions to a portion between the mini dioxide and the shallow trench insulation structure adjacent to the mini dioxide to form a drain, and forming a source in the second P well at the same time.

In the aforementioned method of manufacturing LIGBT, by using HTO, which has a relatively less stress than silicon nitride, as the mini-oxide that reduce the surface electric field of the LIGBT, no dislocation will be introduced on the edge of the active region. By performing a drive-in to the first N well and the first P well, the HTO is densified, the wet etching rate of the HTO is significantly reduced, the etching to the mini-oxide kept from the HTO etching can be stably controlled in the subsequent cleaning process, the stability of volume production is ensured, and the method can thus be applied in volume production.

BRIEF DESCRIPTION OF THE DRAWINGS

The above objects, features and advantages of the present disclosure will become more apparent by describing in detail embodiments thereof with reference to the accompanying drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

The present disclosure will be described in the following with reference to the accompanying drawings and the embodiments in order to make the above objects, features and advantages of the present disclosure more apparent, the specific embodiments will be described in detail in combination with the accompanying drawings. Numerous specific details are described hereinafter in order to facilitate a thorough understanding of the present disclosure. The various embodiments of the disclosure may, however, be embodied in many different forms and should not be construed as limited to the specific embodiments set forth hereinafter, and people skilled in the art can make similar modifications without departing from the spirit of the present disclosure.

It should be understood that when an element is defined as "fixed to" another element, it is either directly on an element or indirectly on an element with a mediating element. When an element is considered being "connected" to another element, it is either directly connected to an element or indirectly connected to an element with an mediating element. The terms used in the disclosure such as "up right", "horizontal", "upper", "lower", "left", "right" and other language are intended for descriptive purpose only.

Unless otherwise defined, the technical and scientific terms used herein have the same meaning to the understanding of a person skilled in the art where the present invention pertains. The terms used in the specification of the present invention is for the purpose of describing the embodiments of the present invention, as opposed to limiting thereto. The language "and/or" used in the disclosure refers to any and all combinations of the one or multiple items listed.

After experiments and research, the inventor discovered that the reason why a large number of dislocations are introduced in the edge of an active region in using conventional LOCOS (Local Oxidation of Silicon) to make the mini-oxide is that the mini-oxide is formed subsequent to the Shallow Trench Isolation (STI), while when the silicon nitride is being deposited in the LOCOS process, as the High Density Plasma (HDP) stresses of the silicon nitride toward the active region and the trench region are different, thereby introducing dislocations in the edge of the active region.

Figure 1:
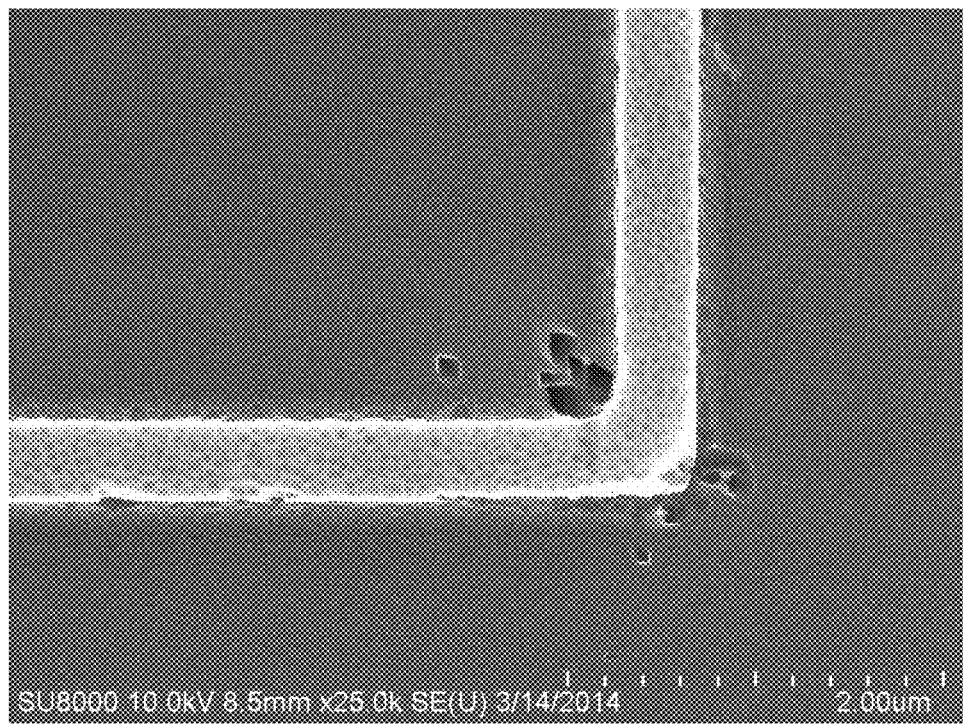
FIG. 1 is a microscope photo showing dislocations introduced on the edge of the active region.
Figure 2:
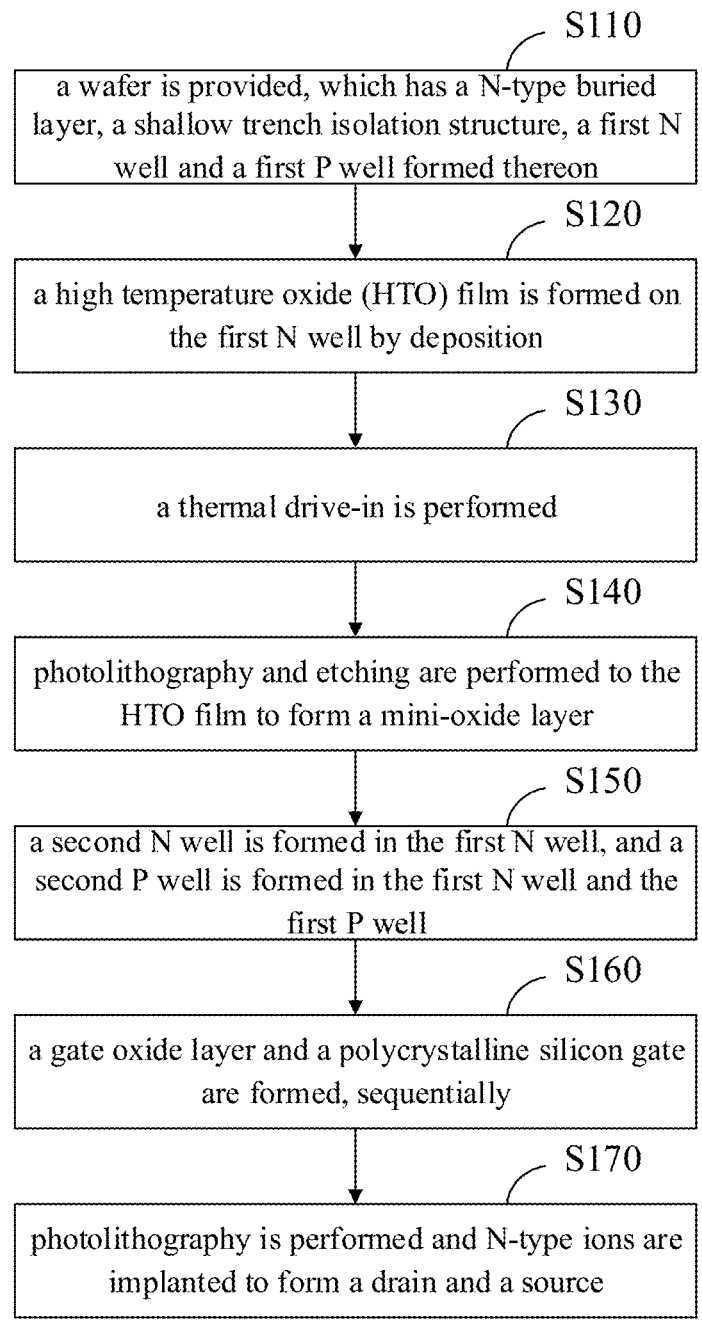
FIG. 2 is a flowchart of the method of manufacturing LIGBT according to an embodiment.

FIG. 2 is a flowchart of a method of manufacturing LIGBT according to an embodiment.

In step S110, a wafer is provided, which has a N-type buried layer, a shallow trench isolation structure, a first N well and a first P well formed thereon.

The shallow trench isolation structure, the first N well, and the first P well are formed on the N-type buried layer. The details of the step will be described later, or the step S110 can also be completed using methods known to a person skilled in the art.

In step S120, a high temperature oxide (HTO) film is formed on the first N well by deposition.

In the illustrated embodiment, the HTO film is formed by depositing a silicon dioxide using a low temperature furnace tube at 750° C. to 850° C. (silicon oxides of other valence may be generated at the same time), $SiH_2Cl_2$ and $N_2O$ are used as the reaction gas. In other embodiments, the SiH2Cl2 can be replaced by silicane.

In step S130, a thermal drive-in is performed.

This step is to postpone the drive-in of the first N well and the first P well that are formed in S110, such that the HTO film is densified in the high temperature process during drive-in. Since there is a step of wet etching/cleaning in the subsequent process, an ordinary high temperature oxide film will be seriously etched and may not be suitable to serve as mini-oxide any longer. According to The method of manufacturing LIGBT of the present disclosure, by performing a thermal drive-in to the wafer to densify the HTO film in step S130, the wet etching rate of the HTO is significantly reduced, the etching to the mini-oxide kept from the HTO etching can be stably controlled in the subsequent cleaning process, the stability of volume production is ensured, and the method can thus be applied in volume production. Since the drive-in of the first N well and the first P well is completed in the same step, the cost can be reduced.

In the present embodiment, the temperature for thermal drive-in is over 1000° C., and the duration is over 60 minutes, so as to provide a relatively notable effect to the densification of the mini-oxide. The drive-in is performed in an inert gas environment, such as in nitrogen gas, so as to ensure that the wafer will not have any undesired chemical reaction with the gas in the furnace.

In step S140, photolithography and etching are performed to the HTO film to form a mini-oxide layer.

A specific region of HTO to be preserved is defined by photolithography and other regions are etched, thus the remaining HTO serves as mini-oxide. In alternative embodiments, the thermal drive-in can be performed after the photolithography and etching of the HTO film. The position where the mini-oxide is formed should refer to the position of the drain and the gate, which will be described below.

In step S150, a second N well is formed in the first N well, and a second P well is formed in the first N well and the first P well.

By photolithography and ion implantation, the second N well is formed in the first N well, and the second P well is formed in the first P well and the first N well. After the second N well is formed, the mini-oxide layer is right above it, i.e., the left and right ends of the mini-oxide are both in the scope of the second N well. A certain distance A between the mini-oxide and the second P well is reserved as an accumulation region to ensure that the device channel can be turned on and is free from risk of channel break. In one embodiment, the value of A is between 0.2 micrometers to 1.5 micrometers.

In step S160, a gate oxide layer and a polycrystalline silicon gate are formed, sequentially.

In the present embodiment, an oxide layer grows on the surface of the wafer by heat oxidation, and polycrystalline silicon is deposited on the oxide layer, finally, redundant oxide layer and polycrystalline silicon are removed by photolithography and etching and the gate oxide layer and the polycrystalline silicon gate are formed. One end of the gate oxide layer and the polycrystalline silicon gate extends to the second P well in the first N well, while the other end of the gate oxide layer and the polycrystalline silicon gate extends to the mini-oxide layer on the second N well.

In step S170, photolithography is performed and N-type ions are implanted to form a drain and a source.

A diffusion can be performed after the implantation, such that a drain is formed in the second N well and between the mini dioxide and the shallow trench insulation structure adjacent to the mini dioxide, and form a source in the second P well at the same time. The distance B between the N+ drain formed and the polycrystalline silicon can be as less as 0 (i.e., a self-aligned gate implantation process can be employed); the specific value of B is selected based on the voltage tolerance requirement and the thickness of the mini dioxide layer. In the case the voltage tolerance requirement is relatively moderate, then B can be selected to be 0, and if the voltage tolerance requirement is relatively high, then certain space must be reserved between the N+ drain and the gate; B can likewise be 0 if the mini dioxide layer is sufficiently thick, and certain space should be reserved between the N+ drain and the gate if the mini dioxide is relatively thin.

After step S170 is completed, photolithography as well as a P type ion implantation are performed, and a P type highly doped region is formed between two sources and in the second P well.

Figure 3:
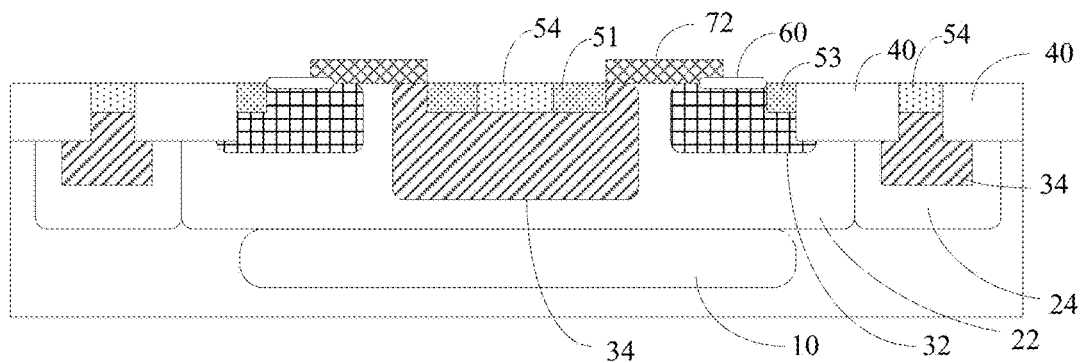
FIG. 3 is a cross-sectional view of the completed LIGBT according to an embodiment.

FIG. 3 is a cross-sectional view of a completed LIGBT device manufactured in accordance to the method of manufacturing LIGBT described above, as the structure in the figure is symmetrical from left to right, reference numerals are merely designated for one side. The LIGBT includes a N-type burial layer 10, a first N well 22, a first P well 24, a second N well 32, a second P well 34, a STI structure 40, a source 51, a drain 53, a P type highly doped region 54, a mini dioxide layer 60 and polycrystalline silicon gate 72. One end of the mini dioxide layer 60 extends to the drain 53 while the other end of the mini dioxide layer 60 extends to bellow the polycrystalline silicon gate 72. The thickness of the mini dioxide layer 60 is related to the voltage tolerance needed by the device. In the embodiment where B=0, an oxide layer of 400 angstroms can guarantee a tolerance of 25 V, and an oxide layer of 1200 angstroms can guarantee a tolerance of 40 V. In a case the value of B is selected properly greater, the oxide layer of 1200 angstroms can increase the voltage tolerance of the device up to 80 V.

The described method of manufacturing LIGBT, by using HTO, which has a relatively less stress than silicon nitride, as the mini-oxide that reduce the surface electric field of the LIGBT, no dislocation will be introduced on the edge of the active region. By step S130, by performing a drive-in to the first N well and the first P well, the HTO is densified, the wet etching rate of the HTO film is significantly reduced, the etching to the mini-oxide kept from the HTO film etching can be stably controlled in the subsequent cleaning process, the stability of volume production is ensured, and the method can thus be applied in volume production. For instance, prior to performing step S150, typically, a thin layer of oxide shall be formed on the front surface of the wafer to act as a barrier layer. In step S150, after the implantation, and before step S160, the barrier layer shall be removed. If the HTO is not densified via drive-in, then the rate of wet etching is very fast and the mini-oxide will be etched as well. While after the densification, the barrier layer can be removed relatively well. In case of other subsequent cleaning steps, the mini-oxide will be preserved relatively well. In one embodiment, the barrier layer is generated by heat oxidation, such as growing 70-90 angstroms at 850-900° C., and the cleaning prior to step S160 is by: corroding for 120 seconds by hydrofluoric acid of 1:100 at a normal temperature.

Figure 4:
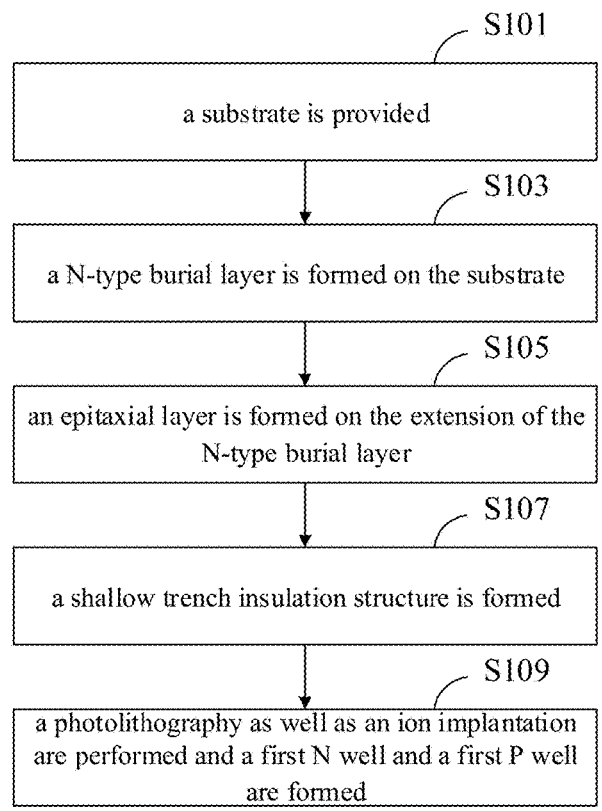
FIG. 4 is a flowchart of an specific implementation of the step S110 according to an embodiment.

FIG. 4 is a flowchart of an example of the step S110 in an embodiment.

In step S101, a substrate is provided.

In the present embodiment, it is to provide a wafer with silicon substrate.

In step S103, a N-type burial layer is formed on the substrate.

Photolithography is performed and N-type ions are implanted, and a N-type burial layer is formed.

In step S105, an epitaxial layer is formed on the extension of the N-type burial layer.

A silicon epitaxial layer is further extended on the N-type burial layer.

In step S107, a shallow trench insulation structure is formed.

Processes known to a person skilled in the art can be employed to make STI structure in the epitaxial layer.

In step S109, photolithography as well as an ion implantation are performed and a first N well and a first P well are formed.

The first N well and the first P well are high voltage N well (HV N well) and high voltage P well (HV P well).

The different technical features of the above embodiments can have various combinations which are not described for the purpose of brevity. Nevertheless, to the extent the combining of the different technical features does not conflict with each other, all such combinations must be regarded as within the scope of the disclosure.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall within the protection scope of the present disclosure. Therefore, the protection scope of the present disclosure shall be subject to the protection scope of the claims.

What is claimed is:

1. A method of manufacturing a lateral insulated-gate bipolar transistor, comprising the steps of:
   providing a wafer having a N-type buried layer, a shallow trench isolation (STI) structure formed on the N-type buried layer, a first N well formed on the N-type buried layer, and a first P well formed on the N-type buried layer;
   forming a high temperature oxide (HTO) film on the first N well by depositing, wherein a depositing temperature is between 750° C. to 850° C.;
   performing a thermal drive-in to the wafer, and performing first photolithography and etching to the HTO film to form a mini-oxide layer;
   performing second photolithography and first implantation of ion, thus forming a second N well in the first N well, and forming a second P well in the first N well and the first P well;
   forming a gate oxide layer and a polycrystalline gate subsequently, wherein one end of the gate oxide layer and the polycrystalline silicon gate extends to the second P well in the first N well, and the other end of the gate oxide layer and the polycrystalline silicon gate extends to the mini-oxide layer on the second N well; and
   performing third photolithography and second implantation of implanting N-type ions to a portion between the mini-oxide and the shallow trench insulation structure adjacent to the mini-oxide to form a drain, and forming a source in the second P well at the same time.

2. The method of claim 1, wherein the thermal drive-in is performed at a temperature over 1000° C. and for over 60 minutes.

3. The method of claim 2, wherein the thermal drive-in is performed in an inert gas environment.

4. The method of claim 1, wherein a reaction gas used in the step of forming the HTO film on the surface of the wafer by depositing are $N_2O$ and $SiH_2Cl_2$.

5. The method of claim 1, wherein the step of providing of the wafer comprises:
   providing a substrate;
   forming a N-type burial layer on the substrate;
   epitaxially forming an epitaxial layer on the N-type burial layer;
   forming a shallow trench insulation structure in the epitaxial layer;
   performing photolithography on a front side of the wafer, and performing ion implantation to form a first N well and a first P well on the N-type burial layer.

* * * * *